United States Patent
Roozenbeek et al.

[11] Patent Number: 5,964,854
[45] Date of Patent: Oct. 12, 1999

[54] CARD CAGE FOR AN ELECTRONIC CONTROL UNIT HAVING SIGNAL-PROCESSING COMPONENTS AND HIGH-SPEED DIGITAL COMPONENTS COUPLED TO A COMMON GROUND PLANE

[75] Inventors: Herman Roozenbeek, Schwieberdingen; Bernd Tepass, Ilsfeld, both of Germany

[73] Assignee: Robert Bosch GmbH, Stuttgart, Germany

[21] Appl. No.: 08/913,277

[22] PCT Filed: Jul. 20, 1996

[86] PCT No.: PCT/DE96/01334

§ 371 Date: Aug. 27, 1997

§ 102(e) Date: Aug. 27, 1997

[87] PCT Pub. No.: WO97/13395

PCT Pub. Date: Apr. 10, 1997

[30] Foreign Application Priority Data

Oct. 2, 1995 [DE] Germany .................. 195 36 848

[51] Int. Cl.[6] .............. G06I 13/00; H02B 1/00; H05K 5/00; H05K 1/00
[52] U.S. Cl. .............. 710/102; 361/600; 361/679; 361/748; 361/794
[58] Field of Search .......................... 361/794, 748, 361/679, 600, 400; 364/489; 174/261, 250; 307/10.1; 710/102

[56] References Cited

U.S. PATENT DOCUMENTS

| | | | |
|---|---|---|---|
| 5,023,753 | 6/1991 | Abe | 361/400 |
| 5,231,308 | 7/1993 | Fisch | 307/10.1 |
| 5,561,584 | 10/1996 | Tang | 361/220 |
| 5,592,391 | 1/1997 | Muyshondt et al. | 364/489 |
| 5,615,225 | 3/1997 | Foster et al. | 379/29 |
| 5,640,293 | 6/1997 | Dawes et al. | 361/93 |
| 5,691,724 | 11/1997 | Aker et al. | 342/104 |
| 5,719,750 | 2/1998 | Iwane | 361/794 |
| 5,734,703 | 3/1998 | Hiyoshi | 379/98 |

*Primary Examiner*—Ayaz R. Sheikh
*Assistant Examiner*—Frantz Blanchard Jean
*Attorney, Agent, or Firm*—Kenyon & Kenyon

[57] ABSTRACT

In the case of a card cage for an electronic control unit having signal-processing analog and/or digital components, high-speed digital components, as well as components having both signal-processing functional parts, as well as high-speed digital functional parts and power components, which are arranged on a multilayer printed-circuit board and are electroconductively connected to a shared ground plane, the signal-processing components of each module having a shared connection to the common ground plane, the radiated interference from the control unit produced by high-frequency interference currents can be reduced, and high current densities in the ground plane and resultant potential shifts can be prevented from adversely affecting the signal processing, in that the signal-processing components are combined into signal-processing modules having at least one shared function, and the ground connections of all components of such a functional module are routed in each case via conductor connections to a common point of connection conductively connected over the shortest path to the shared ground plane, and the high-speed digital and power components are directly linked to the shared ground plane. By introducing an additional voltage-supply plane, the radiated interference from the control unit is able to be further reduced.

27 Claims, 4 Drawing Sheets

CARD CAGE FOR AN ELECTRONIC CONTROL UNIT HAVING SIGNAL-PROCESSING COMPONENTS AND HIGH-SPEED DIGITAL COMPONENTS COUPLED TO A COMMON GROUND PLANE

BACKGROUND OF THE INVENTION

Field of the Invention

The present invention is directed to a card cage for an electronic control unit having signal-processing analog and/or digital components, and high-speed digital components.

Background Information

"High-speed" digital components differ from signal-processing digital components by operating frequency and by associated conducted interference in the area of current and voltage supply or current and voltage discharge. Numbered among the high-speed digital components are, in addition to the microprocessor and the microcontroller, all digital components which belong to a bus system and are connected to an address, data, bus control, or chip select line of a microprocessor or microcontroller (such as an EPROM), RAM and address latch, and which transmit data at frequencies greater than one MHZ.

Besides the signal-processing and the high-speed digital components, a card cage of this type also has components with both high-speed, digital functional parts and signal-processing functional parts. The card cage of this type also has power components, which are mounted on the card cage and, which, e.g., can be a printed-circuit board, together with printed connections for the voltage supply and ground, and connector contacts for signal lines, shielded and ground lines. In this instance, the printed connections can also be designed in a plurality of superposed planes. To avoid a disruptive potential gradient in the ground lines, which can adversely affect the functioning of individual components, it has proven to be advantageous for the ground connections to be electrically connected in a ground plane over a large surface.

In spite of this advantageous configuration, strong power currents discharging via the ground connections of individual components can lead to potential shifts and to significant current densities in the ground plane. This entails the serious drawback that when there are high current densities in the ground plane, small, analog signal voltages are afflicted with unacceptable errors. Moreover, the ground connection of analog, signal-processing, and high-speed digital components on a shared ground plane brings about an undesired high-frequency coupling, which is emitted, above all, via the ground connection or the ground connections of the control unit.

For this reason, there are design approaches, whereby ground planes, which are isolated from each other, are allocated to the high-speed digital components, on the one hand, and to the signal-processing components, on the other hand, analog components being exclusively provided as signal-processing components, and the two isolated ground planes being joined, in each case separately from one another, via conductor connections to a third ground plane. The European Patent No. 0 429 695 discloses an electronic control unit for controlling functions of a motor vehicle. Its ground plane is so conceived for the high-speed digital components that, except for a conductive connection to a shared ground base plate, which also includes the ground connection of the control unit, it is isolated from a ground plane that is allocated to the signal-processing analog components and includes the ground connection for signal and shielded lines. As a result, the high-frequency coupling between the ground plane allocated to the signal-processing analog components and the ground plane allocated to the high-speed digital components is reduced, which, in turn, has a positive effect on the interference radiated via the connecting leads of the control unit.

There is an inherent drawback to this design approach that has to be considered, however. Namely, in spite of the separate design of the two ground planes, which deplete the high current densities produced by the power components and the high-frequency interference currents produced by the high-speed digital components, potential shifts are produced in the analog ground plane connected thereto. This can cause small signals from the signal-processing analog components directly connected to the analog ground plane to be distorted, as well as to propagate through very large current loops. These current loops, in turn, because of their antenna effect, increase the interference radiated by the control unit.

SUMMARY OF THE INVENTION

The present invention makes it possible to avoid radiated interference from the control unit produced by high-frequency interference currents and to prevent high current densities in the ground plane, which are also produced by the power components, from having an adverse effect on the signal processing. This is accomplished by providing only one single, large-surface ground plane and, first of all, by conductively connecting, via a direct path, to this ground plane only the ground connections of the high-speed digital components belonging to the bus system. A direct connection is understood to be conductively connecting a component to the point of connection via the shortest possible path while taking the position of other electrical connections and components into consideration, without connecting a third component therebetween. In contrast to the signal-processing components, the high-speed digital components can also be directly linked to the signal-processing components via a plurality of conductive connections to the shared ground plane, since the interference voltages in the ground plane cannot adversely affect the method of functioning of the high-speed digital components. By directly connecting high-speed digital and power components to the shared ground plane, high-frequency signals fed by the high-speed digital components to the power components flow back on the ground plane directly underneath the signal line. This is because it is precisely on this path, even when it is not designed to be the geometrically shortest path between the two components, that the impedance is the lowest. The currents do not need to make a circuitous route via an additional ground plane or ground line, so that the inductance of the ground connections is significantly decreased, and the current-loop surfaces of the interference currents, which acted as small antennae, are substantially reduced in size. This substantially improves both the radiated interference and the irradiation-resistance of the control unit, and further reduces the expenditure for interference suppression. Therefore, often the need for additional plug capacitors and baffle shields can be eliminated, for example, so that the cost of manufacturing the control unit can be reduced.

However, the signal-processing analog and digital components are not simply linked, individually and directly, to this ground plane, since otherwise their method of functioning would be jeopardized by potential shifts caused by locally varying current densities in the ground plane, or by the unfavorable ground connection of a filter component, or by overly large current-loop surfaces. Even the method of functioning of the signal-processing digital components could be adversely affected by injected, strong interference signals. Instead, the signal-processing analog and digital components, which at least have one shared function, are combined in functional modules, and the ground connections of all the components of such a functional module are linked via conductor connections to a common point of connection (ground reference point). This connection point of a functional module is first linked in each case via the shortest path to the shared ground plane. As a result, all components which belong to a signal-processing functional module, are linked only via one connection point to the ground plane. The interference current of a high-speed digital component, which is further augmented by power components and is discharged via the ground plane, can now merely shift the potential at the point of connection common to all components of one signal-processing functional module, through which means the potential of all individual components of the functional module in question rise or fall to the same extent. Thus, no shift in potential takes place between the individual components of the functional module, and the interference current is prevented from having an adverse effect on the method of functioning of the module.

The point of connection of any one functional module has only one single connection to the ground plane. However, it is also possible to design the point of connection with a plurality of contacting connections that are situated closely together and lead to the common ground plane. It is crucial in this case that the contacting connections to the ground plane be situated closely enough together to ensure that the points of contact have an essentially identical potential, and that no potential difference that would adversely affect the method of functioning of the module is able to arise between the points of contact with the ground plane. Thus, it is conceivable, for example, for the point of connection to have two contacts that are spaced apart by only a few millimeters.

If a signal-processing functional module contains an integrated circuit (IC), then it is advantageous to arrange the point of connection of the functional module in the direct vicinity of the ground connection of the IC, and to integrate the negative connection of a back-up capacitor or decoupling capacitor in the point of connection. This is done by linking the ground connection of the integrated circuit directly to the negative connection of the capacitor, by likewise linking the remaining components of the functional module to the negative terminal of the capacitor via conductor connections, and by directly connecting the negative terminal of the capacitor to the shared ground plane.

Furthermore, by having a direct conductor connection of the power components to the shared ground plane, there is no need for additional recesses in the ground plane for a power ground connection. This makes it possible to further reduce the high-frequency voltage differences in the ground plane. By routing the signal-line and ground-line connections, irradiation loops are kept as small as possible, it being possible to avoid a signal feed-over when no foreign signal lines, i.e., no signal lines belonging to another functional module, are placed near the position of a signal-processing functional module.

In the case of a component having a high-speed digital functional part and a signal-processing, analog functional part, e.g., a microcontroller having an integrated analog-to-digital converter, the connections of the analog-to-digital converter are linked in the same manner as the connections of an independent, signal-processing analog functional module, separately from the remaining connections of the controller via a point of connection allocated to the signal-processing functional part to the ground plane.

A design, in the form of a multilayer printed-circuit board, represents an especially advantageous refinement of the card cage. The point of connection common to all of the ground connections of the components of one functional module is able to be easily realized by the connection point that are customary in circuit-board technology, and the ground lines can be connected via a plurality of layers of the printed-circuit board to the connection point, which substantially increases the available design space for arranging the components and the connection lines.

Also by introducing a voltage-supply plane comprising voltage-supply lines and a conductive planar section, the current-loop surfaces and the galvanic coupling via the positive voltage supply of a signal-processing functional module are also reduced, the individual voltage-supply connections of the components of the functional module being connected, in the same way as the ground connections, to a point of connection, which, in turn, is directly linked to a voltage-supply line running in the voltage-supply plane. It is advantageous not to directly connect a high-speed digital component having a plurality of voltage-supply terminals, e.g., a microprocessor, to the conductive planar section of the voltage-supply plane, but rather to first link each voltage-supply connection to the positive terminal of a back-up or decoupling capacitor placed in the immediate vicinity of the microprocessor, and then to directly connect this positive terminal to the conductive planar section. To optimize the effect of the back-up or decoupling capacitor, the total inductance between the microprocessor connections and the capacitor terminals should be kept as low as possible. This is achieved, on the one hand, by positioning the back-up or decoupling capacitor in the immediate vicinity of the microprocessor's voltage-supply terminal and by linking it with the shortest possible connection thereto and, on the other hand, by directly connecting the ground connection of the microprocessor and the negative terminal of the capacitor in each case to the ground plane.

To reduce the interference radiated over the connecting leads of the control unit, it is advantageous to directly connect the shielded line to the shared ground plane. The high-speed digital components should be arranged as closely together and as far away from the control unit plug as possible.

DETAILED DESCRIPTION

Figure 1:
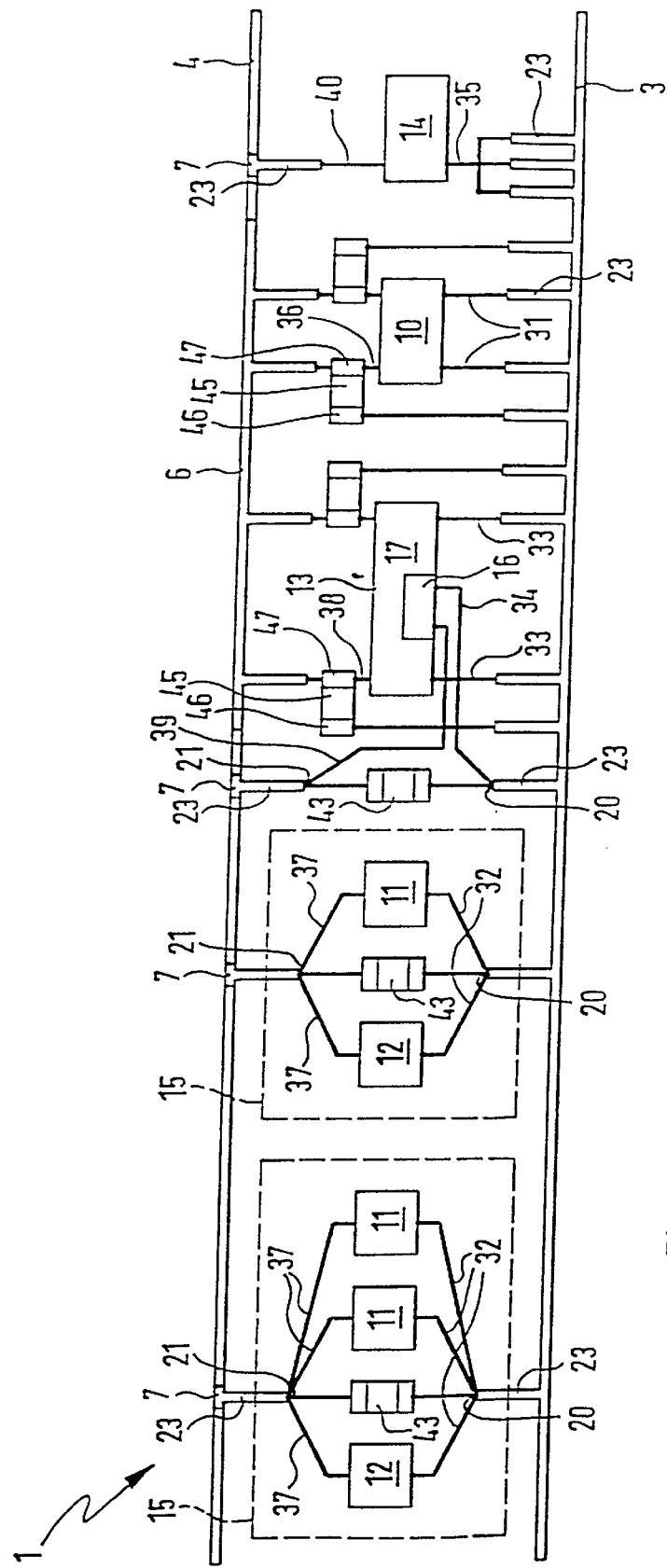
FIG. 1 shows a schematic design of a multi-layer printed circuit board having components, which are conductively connected to a shared ground plane and to a shared voltage-supply plane.

As illustrated in FIG. 1, a card cage for an electronic control unit comprises signal-processing analog components 11, signal-processing digital components 12, high-speed digital components 10 and components 13, both with high-speed digital functional parts 17, as well as with signal-processing functional parts 16, as well as with power components 14, which are arranged on a card cage designed as a multilayer printed-circuit board 1. The connector contacts for signal lines, shielded and ground lines, and the connector leads interconnecting the components are not shown in FIG. 1. The depicted components can be located both on the top side designated as the component side, as well as on the bottom side of the card cage designated as the soldered side. In the case of multilayer printed-circuit board 1, a one-piece, planar, shared ground plane 3 is provided, to which all ground connections of the components are electroconductively connected, and vertical, galvanic connections 23, such as vias, routed through the multilayer printed-circuit board 1, are provided as ground connections to the ground plane 3.

Figure 2:
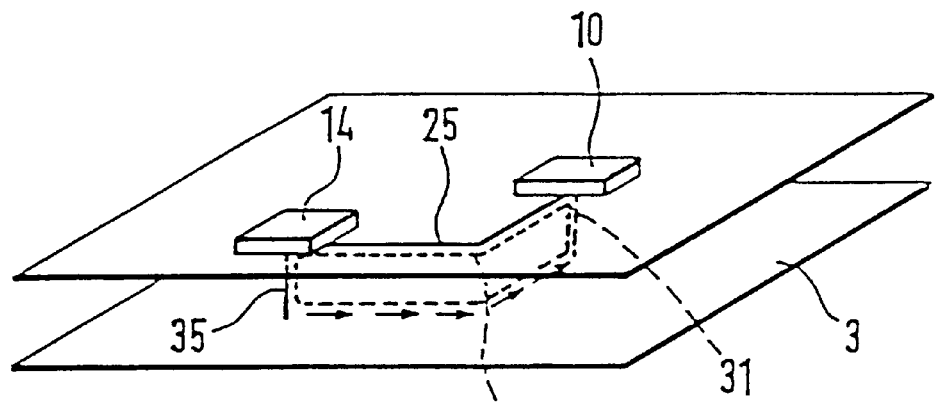
FIG. 2 shows schematically an interference current circuit between a high-speed digital component and a power component.

The ground connections of the high-speed digital components 10 are directly conductively connected to ground plane 3. The high-speed digital components 10 can also be thereby electroconductively connected via a plurality of connections 31 to the shared ground plane 3. Power components 14 are likewise directly conductively connected via connections 35 to the shared ground plane 3. In this instance, the ground connection of a power component can also be connected by way of a plurality of vias 23, situated closely together, to the shared ground plane. A high-frequency interference current having a steep signal edge, which is produced by a high-speed digital component 10, such as a microprocessor controlling a power component, is transmitted via signal line 25 to power component 14, and is amplified by the same, is depleted over the shared ground plane 3, as is apparent in FIG. 2, directly beneath signal line 25, making current-loop surface area 26 for the interference current very small. Because of their small dimensions, these small interference-current loops act only as small antennae for emitting radiated interference or for receiving irradiated interference. It is expedient to arrange the high-speed digital components in an area situated on the card cage farther away from the signal-processing functional modules and from the control unit plug, in order to further reduce the high-frequency coupling.

As shown in FIG. 1, the signal-processing, analog components 11 and the signal-processing, digital components 12 having at least one shared function are combined to form signal-processing functional modules 15, the ground connections of the components of each functional module being routed via conductor connections 32 to a shared point of connection 20, which is conductively connected via a direct path 23 to the shared ground plane 3 and, at the same time, the point of connection being a back-up or decoupling capacitor 43. Conductor connections 32 of the components and of capacitor 43 can thereby be linked via one or also a plurality of layers of the multilayer printed-circuit board to point of connection 20 of the functional module 15. Through the shared point of connection 20, the same electric potential is applied to all ground connections of the components of a signal-processing functional module 15, so that the high-frequency interference current of a high-speed digital component 10, which is depleted over the shared ground plane 3, raises and lowers to the same extent the frame potential of all components belonging to the same functional module by way of via 23 of point of connection 20, without a potential shift occurring between the components of one functional module. In this manner, by introducing a point of connection 20 common to all components of one functional module, the signal transmission of the functional module will no longer be adversely affected by the interference current. Alternatively to the exemplary design shown here, it is also possible to link the point of connection by way of a plurality of vias 23 situated closely together to common ground plane 3. It is crucial in this case that the points of contact of the vias 23 with the ground plane 3 lie closely enough together that no potential difference capable of adversely affecting the method of functioning of the module can arise between the points of contact.

Figure 3:
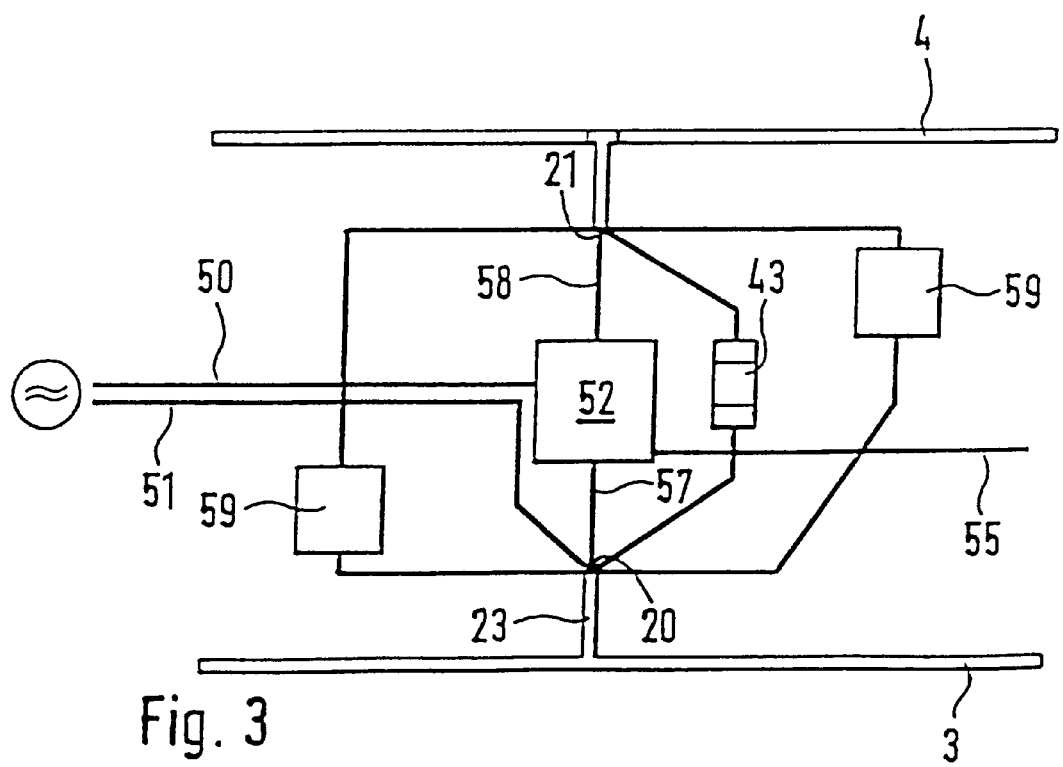
FIG. 3 shows a specific embodiment of the present invention of a signal-processing module.

FIG. 3 depicts a specific embodiment of the present invention of a signal-processing module. Via signal line 50, an analog signal with a small voltage is transmitted to component 52 and transformed by said component 52 into a digital signal, which is output via signal output line 55. Linked between voltage-supply terminal 58 and ground connection 57 of component 52 is a back-up or decoupling capacitor 43. To avoid irradiation loops, ground-line connection 51 of a signal-voltage sensor (not shown) runs as closely as possible next to the signal-carrying signal line 50 and is linked to ground connection 57 of component 52 at point of connection 20, together with the back-up or decoupling capacitor 43. All further local ground connections 59 of the signal-processing module are linked to point of connection 20. Point of connection 20 is directly, conductively connected by way of a via 23 to the shared ground plane 3 of the control unit. As is apparent from FIG. 3, all ground connections of the signal-processing module are linked via point of connection 20 to the same potential.

Figure 4:
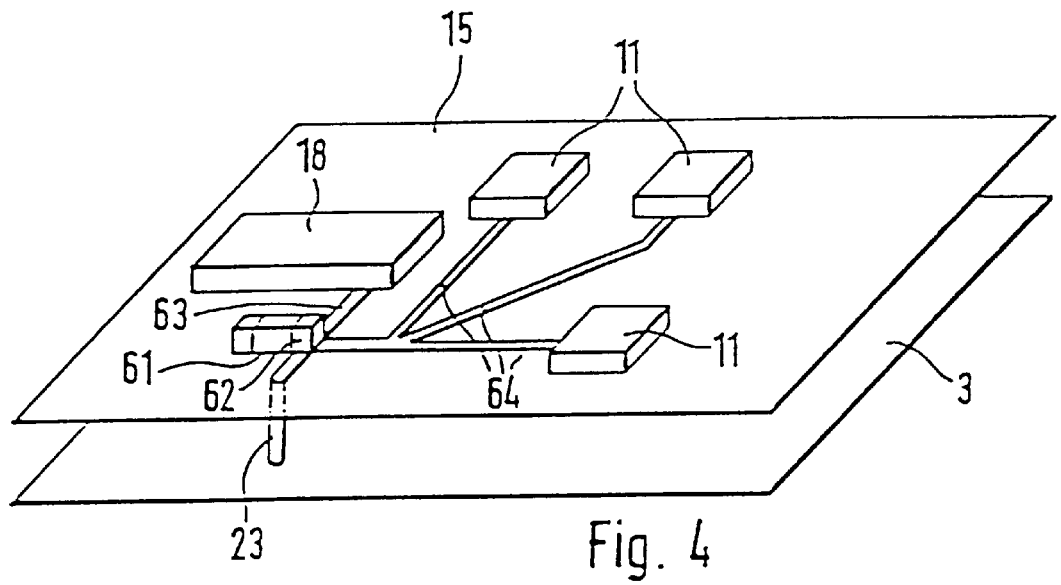
FIG. 4 shows a first embodiment according to the present invention of the point of connection of a signal-processing functional module containing an IC to the shared ground plane.
Figure 5:
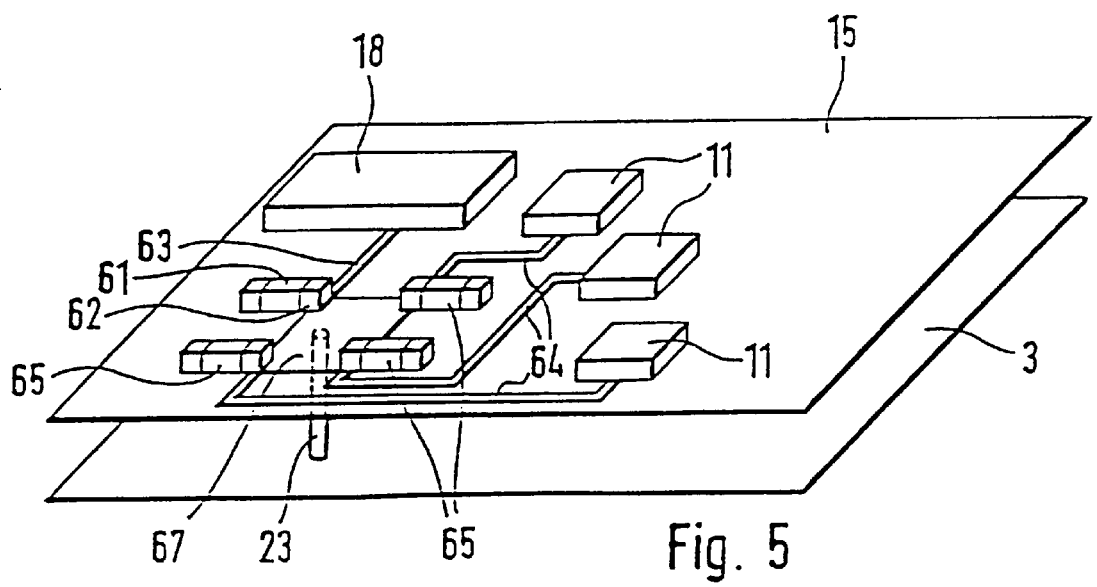
FIG. 5 shows a second embodiment according to the present invention of the point of connection of a signal-processing functional module containing an IC to the shared ground plane.

If, as shown in FIG. 4, a signal-processing functional module 15 contains an integrated circuit (IC) 18, then the point of connection of functional module 15 is arranged in the immediate vicinity of the ground connection of IC 18. As illustrated in FIG. 4, the point of connection comprises negative terminal 62 of a back-up or decoupling capacitor 61, which is directly linked via a low-inductance connection 63 to the IC's ground connection. Negative terminal 62 of capacitor 61 integrated in the point of connection is linked by way of a via 23 to the shared ground plane 3. The remaining signal-processing components 11 of the functional module are likewise linked via conductor connections 64 to negative terminal 62 of the capacitor 61. Alternatively to the exemplary design shown here of the point of connection, it is also possible to place via 23 directly underneath negative terminal 62 of capacitor 61. Another specific embodiment of the present invention of the point of connection is illustrated in FIG. 5. The IC's ground connection is linked at low inductance via a connection 63 to negative terminal 62 of a back-up or decoupling capacitor 61. This, in turn, is connected via a monoplane to the negative terminals of three input filter capacitors 65 of the IC 18. Via 23, which is integrated in the point of connection, is situated in the middle underneath the uniplanar connection 67 of the capacitors. The ground connections of the other signal-processing components 11 of functional module 15 are conductively connected via conductor connections 64 to surface-area connection 67.

If a component 13 is comprised both of a signal-processing functional part 16, as well as of a high-speed digital functional part 17, e.g., of a microcontroller having an installed analog-into-digital converter, then, as shown in FIG. 1, ground connection 34 of the signal-processing functional part 16 is treated as the ground connection of an independent, signal-processing functional module and is linked separately from the other ground connections 33 of the component via a point of connection 20 to the shared ground plane 3. Ground connections 33 of the high-speed, digital functional part 17 are individually linked, in the manner of ground connections 31 of a high-speed digital component 10, directly to the shared ground plane 3.

Figure 6:
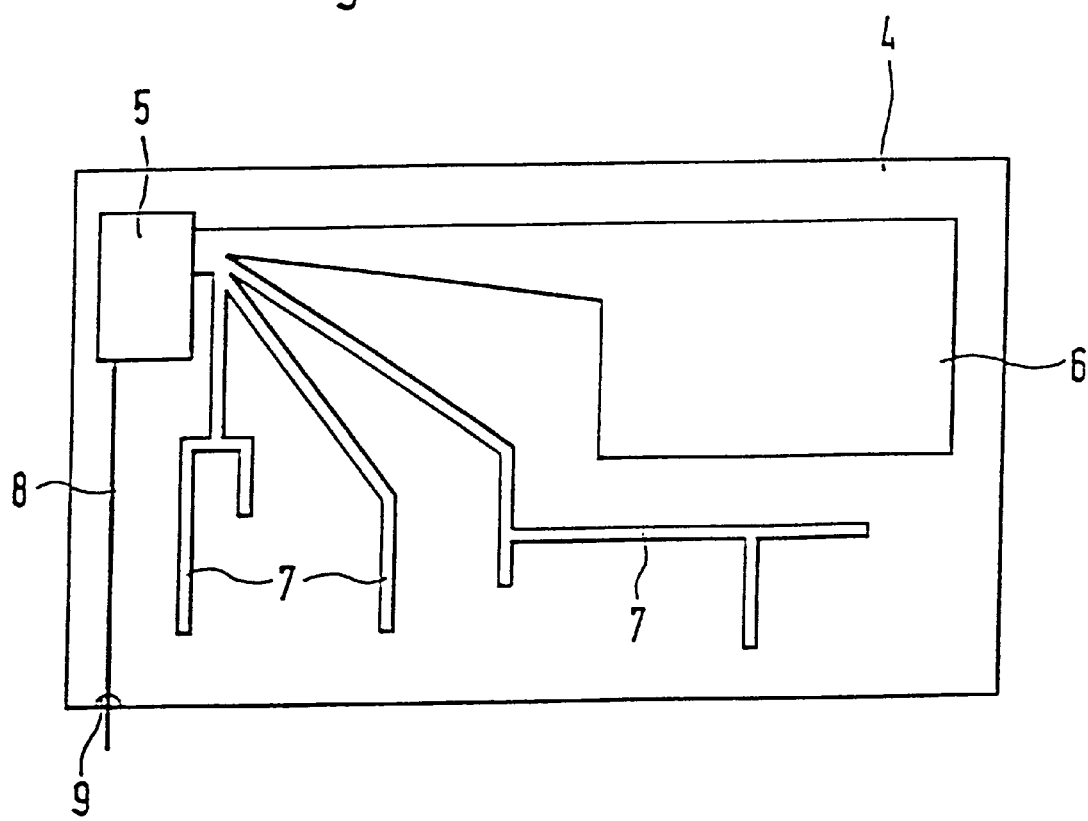
FIG. 6 shows the shared voltage-supply plane.

FIG. 1 depicts a specific embodiment of the card cage where, in addition to a shared large-surface ground plane 3, a voltage-supply plane 4 is also provided. As shown in FIG. 6, voltage-supply plane 4 is comprised of individual voltage-supply lines 7 and of a planar section 6, which is linked to a shared voltage stabilizer 5. Voltage stabilizer 5 is linked via another line 8 to unit plug 9. Power components 14 are directly, conductively connected via connections 40 to voltage-supply lines 7 of voltage-supply plane 4. The conductive planar section 6 of voltage-supply plane 4 is situated on multilayer printed-circuit board 1 directly above or underneath the high-speed digital components 10 and the high-speed, digital functional parts 17 of combined components 13. Voltage-supply terminals 36 of the high-speed digital components 10 are linked to positive terminal 47 of a back-up or decoupling capacitor 45 placed in the immediate vicinity of component 10. Connection 36 between the voltage-supply terminal of component 10 and positive terminal 47 of the capacitor 45 is as short and-flat as possible to keep the total inductance as low as possible. Positive terminal 47 of capacitor 45 is directly connected to the conductive planar section 6 of voltage-supply plane 4. Negative terminal 46 of capacitor 45 and the ground connection of the high-speed digital component are each directly connected to the shared ground plane 3.

In the same way as the ground connections, the high-speed digital components can be linked via a plurality of connections 36 to planar section 6 of voltage-supply plane 4. In the same manner, voltage-supply terminals 38 of components 13, which are provided with a high-speed, digital functional part 17, are linked to voltage-supply plane 4.

Components 11 and 12, which are combined to form a signal-processing functional module 15, are routed via conductor connections 37 to a shared point of connection 21, which is conductively connected over a direct path to voltage-supply lines 7 of the shared voltage-supply plane 4. Point of connection 21 is also the point of connection of back-up or decoupling capacitor 43 to the voltage-supply plane. Conductor connections 37 can also be linked via a plurality of layers of the multilayer printed-circuit board to the via of connection point 21 of the functional module. In the same way as the terminal of a signal-processing module, voltage-supply terminal 39 of signal-processing functional part 16 of a combined component 13 is connected to a voltage-supply line 7 of voltage-supply plane 4.

What is claimed is:

1. A card cage for an electronic control unit, comprising:
a common ground plane;
signal-processing components including at least one of an analog component and a digital component, the signal-processing components being combined into a plurality of modules, wherein the signal-processing components of each module have at least one shared function, wherein the signal-processing components of each module are connected to the common ground plane via a single corresponding connection point of a plurality of shared connection points, and wherein the single corresponding connection point is one of a single via and a plurality of interconnected vias which are situated substantially near one another; and
high-speed digital components, each of the high-speed digital components being individually connected via a direct path to the common ground plane.

2. The card cage according to claim 1, wherein the high-speed digital components have an operating frequency specific to a data-transmission frequency of data buses of a data-processing module.

3. The card cage according to claim 1, wherein the interconnected vias lead to a plurality of points, each of the points having a potential that conforms to a potential of the common ground plane.

4. The card cage according to claim 1, further comprising:
at least one power component, the at least one power component being individually connected to the common ground plane.

5. The card cage according to claim 1, wherein the single corresponding connection point includes a shortest connection to ground of a capacitor.

6. The card cage according to claim 1, wherein a signal-line connection and a ground-line connection of the signal-processing components are configured adjacent to each other to avoid irradiation loops.

7. The card cage according to claim 1, wherein at least two of the high-speed digital components are linked via a plurality of ground connections over the direct path to the common ground plane.

8. The card cage according to claim 1, further comprising:
a component having both a high-speed digital functional part and a signal-processing functional part, the signal-processing functional part including at least one of an analog functional part and a digital functional part,
wherein the high-speed digital functional part is individually connected to the common ground plane by at least one ground connection, and the signal-processing functional part is connected to the common ground plane by the single corresponding connection point.

9. The card cage according to claim 1, further comprising a multilayer printed-circuit board having at least one electrical connection of at least one component and at least one superposed layer including at least one of a conductor arrangement and a printed circuit trace, the at least one superposed layer being the common ground plane.

10. The card cage according to claim 9, wherein at least one electrical connection to the common ground plane runs perpendicular to the multilayer printed-circuit board.

11. The card cage according to claim 9, wherein a ground line coupled to the signal-processing components of one of the modules is routed through at least one layer of the multilayer printed-circuit board to the single corresponding connection point, and wherein the single corresponding connection point has an electrical connection leading to the common ground plane running perpendicular to the multilayer printed-circuit board.

12. The card cage according to claim 9, wherein the at least one electrical connection includes a via running perpendicular to the multilayer printed-circuit board.

13. The card cage according to claim 1, wherein a shielded line of a signal line leading to the card cage is directly linked to the common ground plane.

14. The card cage according to claim 1, wherein each of the signal-processing components includes the analog component and the digital component.

15. The card cage according to claim 14, wherein the analog and digital components of each of the signal-processing components are connected to the common ground plane via the single corresponding connection point.

16. A card cage for an electronic control unit, comprising:
a common ground plane;
signal-processing components, the signal-processing components including at least one of an analog component and a digital component, the signal-processing components being combined into modules, wherein the signal-processing components of each module have at least one shared function, and wherein the signal-processing components of each module are connected to the common ground plane via a first single connection point of a plurality of first shared connection points;
high-speed digital components, each of the high-speed digital components being individually electroconductively connected via a direct path to the common ground plane; and
a voltage-supply plane having at least one voltage-supply line and at least one conductive planar section,
wherein the first single connection point is one of a single via and a plurality of interconnected vias which are situated substantially close to one another,
wherein each of the signal-processing components of a first one of the modules is conductively connected to a corresponding second shared connection point which is connected to the at least one voltage-supply line of the at least one voltage-supply plane, and
wherein the high-speed digital components are individually conductively connected to the at least one conductive planar section of the at least one voltage-supply plane.

17. The card cage according to claim 16, further comprising:
at least one power component, the at least one power component being connected to the at least one voltage-supply line of the voltage-supply plane and being individually connected to the common ground plane.

18. The card cage according to claim 16, wherein at least one of the first shared connection points is a shortest connection to the common ground plane of a capacitor, and the second shared connection point is a shortest connection to the at least one voltage-supply plane of the capacitor.

19. The card cage according to claim 16, wherein a signal-line connection and a ground-line connection, of the signal-processing components, are configured next to each other to avoid irradiation loops.

20. The card cage according to claim 16, wherein a voltage-supply terminal of the high-speed digital components is connected to a positive terminal of a capacitor arranged in proximity to the voltage-supply terminal, the positive terminal of the capacitor being directly connected to the at least one conductive planar section of the voltage-supply plane, and a ground connection of the high-speed digital components being directly connected to the common ground plane.

21. The card cage according to claim 16, further comprising:
a component having both a high-speed digital functional part and a signal-processing functional part, the signal-processing functional part including at least one of an analog functional part and a digital functional part,
wherein the high-speed digital functional part is individually connected to the common ground plane by at least one ground connection, and the signal-processing functional part is connected to the common ground plane by the first single connection point, and
wherein the high-speed digital functional part is individually connected to the at least one conductive planar section of the voltage-supply plane, and the signal-processing functional part is connected to the at least one voltage-supply line of the voltage-supply plane by the second shared connection point.

22. The card cage according to claim 16, wherein the card cage includes a multilayer printed-circuit board having at least one electrical connection of at least one component as a plurality of superposed layers including at least one of a conductor arrangement and a printed circuit trace, at least one of the superposed layers being the common ground plane and at least another one of the superposed layers being the voltage-supply plane.

23. The card cage according to claim 22, wherein at least one electrical connection to the common ground plane runs perpendicular to the multilayer printed-circuit board, and at least one electrical connection to the voltage-supply plane runs perpendicular to the multilayer printed-circuit board.

24. The card cage according to claim 22, wherein a ground line of the signal-processing components of one of the modules is routed through at least one first layer of the multilayer printed-circuit board to the first single connection point, the first single connection point having an electrical connection leading to the common ground plane running perpendicular to the multilayer printed-circuit board, and wherein a voltage-supply line of the signal-processing components is routed through at least one second layer of the multilayer printed-circuit board to the second shared connection point, the second shared connection point having an electrical connection leading to the voltage-supply plane running perpendicular to the multilayer printed-circuit board.

25. The card cage according to claim 22, wherein the at least one electrical connection includes a via running perpendicular to the multilayer printed-circuit board.

26. The card cage according to claim 16, wherein each of the signal-processing components includes the analog component and the digital component.

27. The card cage according to claim 26, wherein the analog and digital components of each of the signal-processing components are connected to the common ground plane via the first single connection point.

* * * * *